(12) United States Patent
Gumann et al.

(10) Patent No.: US 10,833,240 B2
(45) Date of Patent: Nov. 10, 2020

(54) THERMALIZATION OF CRYOGENIC QUANTUM CIRCUITS

(71) Applicant: International Business Machines Corporation, Armonk, NY (US)

(72) Inventors: Patryk Gumann, Tarrytown, NY (US); Salvatore Bernardo Olivadese, Stamford, CT (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/186,255

(22) Filed: Nov. 9, 2018

(65) Prior Publication Data

US 2020/0152852 A1    May 14, 2020

(51) Int. Cl.
*H01L 21/00* (2006.01)
*H01L 39/24* (2006.01)
*B32B 15/01* (2006.01)
*H01L 39/02* (2006.01)

(52) U.S. Cl.
CPC ............ *H01L 39/24* (2013.01); *B32B 15/018* (2013.01); *H01L 39/025* (2013.01)

(58) Field of Classification Search
CPC ...... H01L 39/24; H01L 39/025; B32B 15/018
See application file for complete search history.

(56) References Cited

U.S. PATENT DOCUMENTS

| 5,543,333 | A | 8/1996 | Holdermann |
| 6,841,413 | B2 | 1/2005 | Liu et al. |
| 7,449,780 | B2 | 11/2008 | Hue et al. |
| 8,846,532 | B2 | 9/2014 | Feng et al. |
| 9,524,470 | B1 * | 12/2016 | Chow ............... H01L 25/04 |
| 9,728,412 | B2 | 8/2017 | Alberti et al. |
| 2010/0098840 | A1 | 4/2010 | Du et al. |

OTHER PUBLICATIONS

Alain Rufenacht et al., Cryocooled 10 V Programmable Josephson Voltage Standard, Jun. 2015.
A Soltani et al., Laser sintering of copper nanoparticles on top of silicon substrates, Nov. 10, 2015.
Jeffrey P. Gambino, "Thin silicon wafer processing and strength characterization," 20th IEEE International Symposium on the Physical and Failure Analysis of Integrated Circuits (IPFA), 2013, pp. 199-207.

* cited by examiner

*Primary Examiner* — Richard A Booth
(74) *Attorney, Agent, or Firm* — Garg Law Firm, PLLC; Rakesh Garg; Keivan Razavi (57) ABSTRACT

In an embodiment, a device includes a substrate having a thickness, wherein the thickness is a function of energy dissipation of a particle. In an embodiment, the device includes a thermal layer, formed on the substrate, of a first material that exhibits at least a threshold level of thermal conductivity, wherein the threshold level of thermal conductivity is achieved at a cryogenic temperature range in which a quantum circuit operates, and wherein any intervening material exhibits at least a second threshold level of thermal conductivity, wherein the threshold level of thermal conductivity is achieved at a cryogenic temperature range in which a quantum circuit operates.

10 Claims, 6 Drawing Sheets

THERMALIZATION OF CRYOGENIC QUANTUM CIRCUITS

TECHNICAL FIELD

The present invention relates generally to a method, a system, and computer program product for thermalization of quantum circuits. More particularly, the present invention relates to a method, a system, and computer program product for improving thermalization of cryogenic quantum circuits.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, systems behave in much different ways than we are used to in our day-to-day life, taking on more than one state at the same time, and interacting with other systems that are very far away. Quantum computing harnesses these and other quantum phenomena to process and store information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses superposition and entanglement of qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously—superposition state. Where binary computing using semiconductor processors is limited to using just the on and off states (equivalent to 1 and 0 in binary code), a quantum processor harnesses these quantum states of matter to output signals that are usable in data computing. A quantum device uses a set of quantum circuits to perform computational tasks. For example, a quantum device can include at least two quantum circuits, each quantum circuit including at least one qubit.

Conventional computers encode information in bits. Each bit can take the value of 1 or 0. These is and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to be below the $T_c$, critical temperature—electrons form pair, so called Cooper pairs and can act as bosons (instead of fermions). In a qubit, the Josephson junction—which functions as a dispersive non-linear inductor—is electrically connected to a niobium capacitor forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—$|0\rangle$ and $|1\rangle$. These two states may be two energy states of an atom, for example, the ground ($|g\rangle$) and first excited state ($|e\rangle$). Very often superconducting qubits are described as artificial atom, for more intuitive understanding. Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the $|0\rangle$ and $|1\rangle$ states of the qubit. This operational constraint on any circuit that operates with quantum information necessitates special considerations in fabricating semiconductor and superconducting structures that are used in such circuits.

The presently available superconducting quantum circuits are formed using materials that become superconducting at low temperatures, e.g., in the range of 10 millikelvin (mK) to 100 K. For example, presently available superconducting quantum circuits can be formed using Silicon or Sapphire as a substrate. The presently available superconducting quantum circuits are disposed in a housing in a dilution fridge stage. The electronic devices that are used to control, operate, and measure the quantum circuits are usually located outside the dilution fridge that houses the superconducting quantum circuit. The temperature outside the fridge is usually about 300 K (room temperature).

The presently available dilution fridges are cryogenic apparatus which can be used to cool down samples/devices to millikelvin temperatures. However, the transition from room temperature to millikelvin temperatures inside the fridge is not sudden or abrupt. To facilitate the temperature transition and the cooling operation, the dilution fridge consists of multiple thermally-isolated stages (compactly referred to herein as "stage", plural "stages") held at different ambient temperatures. For example, common commercial dilution fridges have 5 temperature-stages inside the fridge 40 K, 4 K, 0.7 K, 0.1 K, 0.01 K (also known as the base stage). To simplify the discussion, we focus below on the input lines inside the fridge. To maintain the temperature difference between the different stages inside the fridge and to protect the quantum circuits from noise coming down the input lines, which originates from room-temperature electronics or blackbody radiation of higher stages or other sources of electromagnetic noise, it is common practice to use lossy transmission lines to connect between two consecutive stages and to incorporate resistive attenuators and filters in the path of these lines at the different stages.

A signal propagating on a line between stages can contain hot electrons, electrons containing more energy as a result of being located outside the fridges at room temperature. Hot electrons can bring thermal noise into the stages. This noise can be in the infrared spectrum.

A signal on a line passing through a stage can contain noise. This noise can be in the microwave frequency spectrum. For the reasons described herein, microwave frequency noise is undesirable when the line and signals relate to quantum computing using q-circuits.

The illustrative embodiments recognize certain disadvantages with the presently available quantum circuits. For example, the materials forming quantum circuits have far from ideal thermal conductance. The illustrative embodiments recognize that a thickness of presently available substrates of quantum circuits negatively affects thermal conductance. For example, thermal noise takes longer to leave a thicker substrate than a thinner substrate. The illustrative embodiments recognize that thermal boundary resistance between quantum circuits and circuit housing affects flow of thermal noise. The illustrative embodiments further recognize that increasing an interface contact area between quantum circuit and circuit housing promotes heat transfer across the interface.

SUMMARY

The illustrative embodiments provide a method, system, and computer program product for improved thermalization of cryogenic quantum circuits. A device of an embodiment includes a substrate having a thickness, wherein the thickness is a function of energy dissipation of a particle. In an embodiment, the device includes a thermal layer, formed on the substrate, of a first material that exhibits at least a threshold level of thermal conductivity, wherein the threshold level of thermal conductivity is achieved at a cryogenic temperature range in which a quantum circuit operates, and wherein any intervening material exhibits at least a second threshold level of thermal conductivity, wherein the threshold level of thermal conductivity is achieved at a cryogenic temperature range in which a quantum circuit operates.

In an embodiment, the thermal layer includes a sintered metal powder. In an embodiment, the intervening material includes a thin film at a bottom of the substrate. In an embodiment, the substrate is milled to reduce the thickness.

In an embodiment, milling is performed by a laser mill. In an embodiment, the thickness of the substrate is in a range between 300 and 200 nanometers, inclusive of each end of the range. In an embodiment, the substrate is etched to reduce the thickness.

In an embodiment, the first material and the intervening material are the same. In an embodiment, the substrate is formed of a second material that exhibits at least a third threshold level of thermal conductivity, wherein the third threshold level of thermal conductivity is achieved at a cryogenic temperature range in which a quantum computing circuit operates.

In an embodiment, the first material comprises at least one of gold, copper, platinum, and silver. In an embodiment, the thickness of the substrate is about 200 nanometers.

An embodiment includes a fabrication method for fabricating the device.

An embodiment includes a fabrication system for fabricating the device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described needs for thermalization of quantum circuits. The illustrative embodiments provide improved thermalization processes for cryogenic quantum circuits.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides an improved thermalization process for cryogenic quantum circuits. Another embodiment provides a fabrication method for the thermalization process, such that the method can be implemented as a software application. The application implementing a fabrication method embodiment can be configured to operate in conjunction with an existing fabrication system—such as a lithography system, or a circuit assembly system.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein.

Furthermore, some compositions, dilutions, temperatures, thicknesses, depths, and other measurements are described herein only as non-limiting examples. Some of these described measurements have been used in experimentations related to certain inventive aspects described herein, and are usable in a preferred embodiment. However, these examples of measurements are not intended to be limiting. From this disclosure, those of ordinary skill in the art will be able to conceive many other variations of the measurements, such as different compositions, dilutions, temperatures, thicknesses, or depths, to achieve similar or comparable results as an embodiment, and such variations are contemplated within the scope of the illustrative embodiments.

Furthermore, a simplified diagram of an example quantum circuit substrate is used in the figures and the illustrative embodiments. In an actual fabrication of a quantum circuit, additional structures that are not shown or described herein may be present, without departing the scope of the illustrative embodiments. Similarly, within the scope of the illustrative embodiments, a shown or described structure layer may be fabricated or implemented differently to yield a similar operation or result as described herein.

Differently shaded portions in the two-dimensional drawings are intended to represent different materials unless expressly described differently where used. The different materials may be replaced with other materials that are known to those of ordinary skill in the art as having a similar property as the described material.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in an actual operation according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
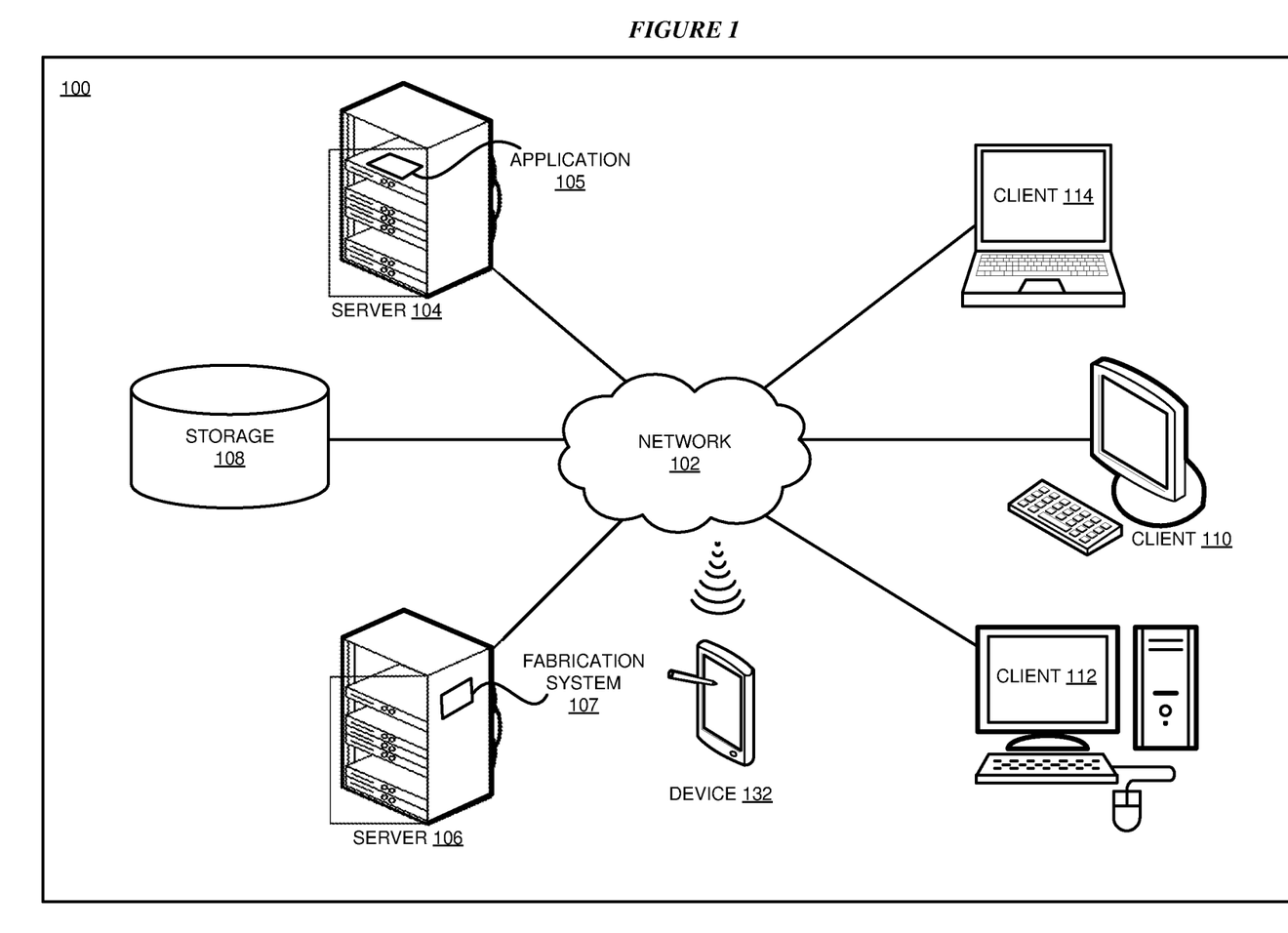
FIG. 1 depicts a block diagram of a network of data processing systems in which illustrative embodiments may be implemented.
Figure 2:
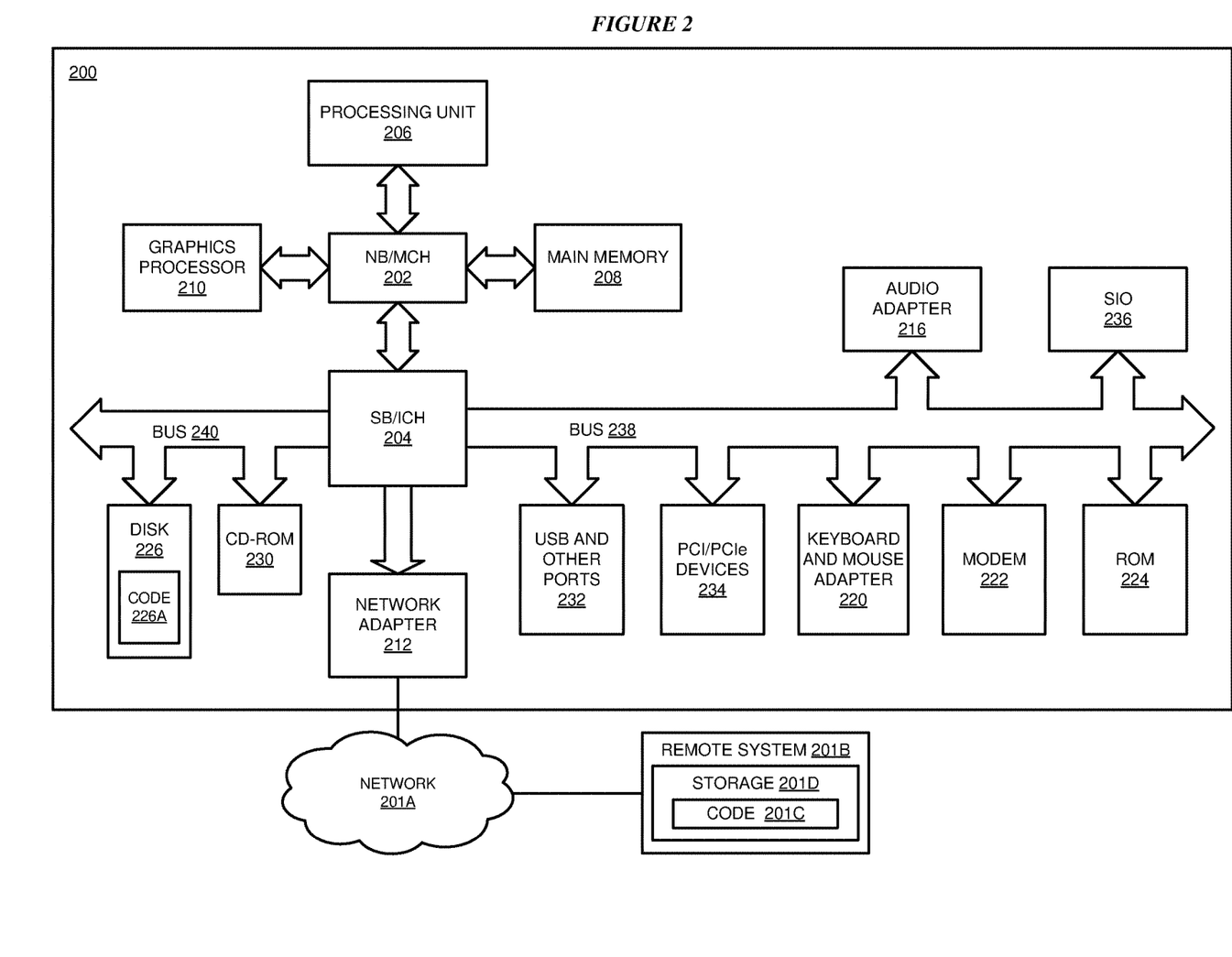
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a device. Application 105 provides instructions to system 107 for an improved thermalization process in a manner described herein.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs memory controller hub (NB/MCH) 202 and input/output (I/O) controller hub (SB/ICH) 204. Processing unit 206, main memory 208, and graphics processor 210 are coupled in the example manner shown in this figure. Local area network (LAN) adapter 212, audio adapter 216, keyboard and mouse adapter 220, modem 222, read only memory (ROM) 224, universal serial bus (USB) and other ports 232, and PCI/PCIe devices 234 are coupled through bus 238. Hard disk drive (HDD) or solid-state drive (SSD) 226 and CD-ROM 230 are coupled through bus 240. A super I/O (SIO) device 236 may be coupled through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

Instructions for applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

Figure 3:
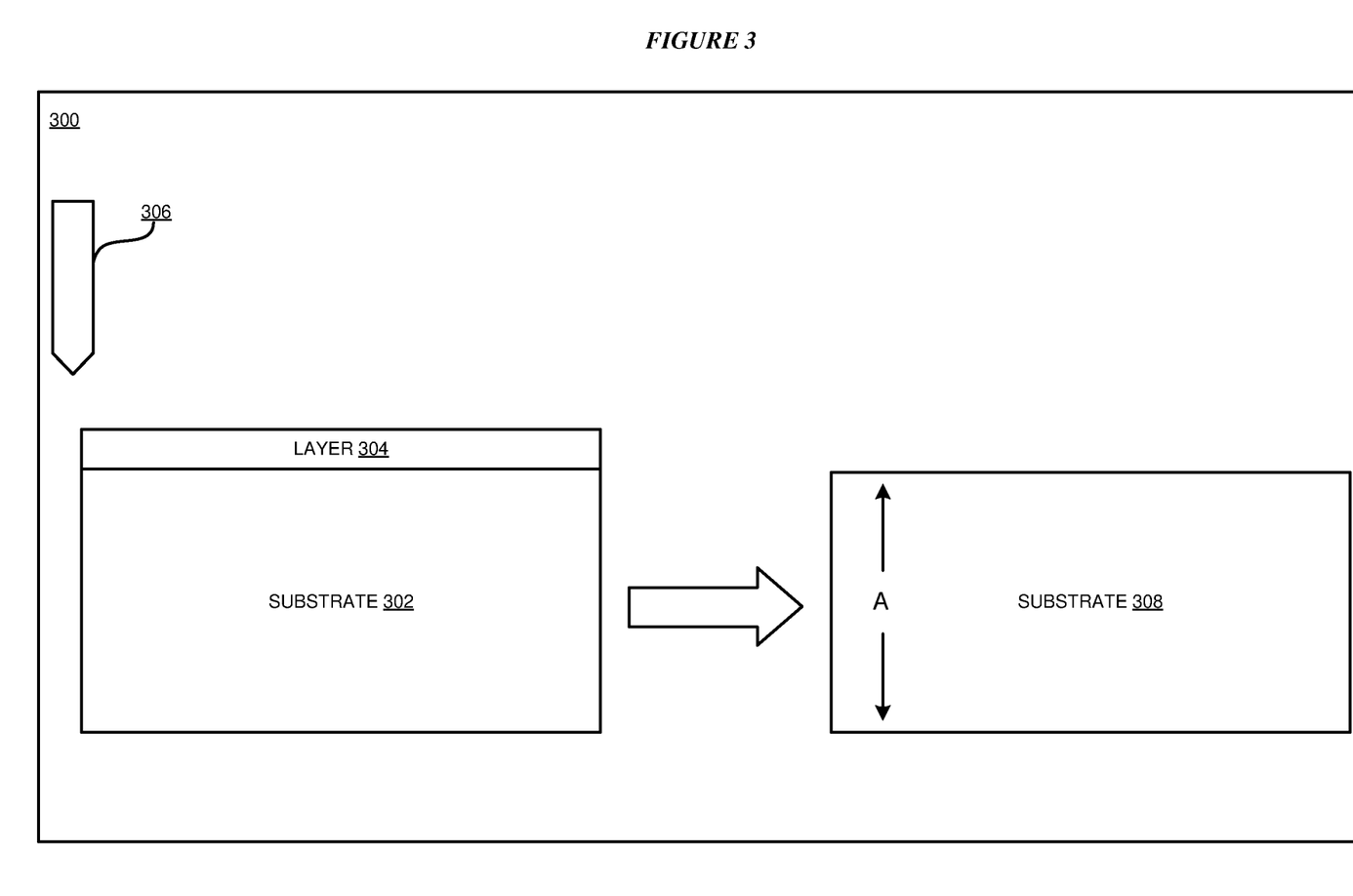
FIG. 3 depicts a block diagram of an example quantum circuit configuration in accordance with an illustrative embodiment.

With reference to FIG. 3, this figure depicts a block diagram of an example quantum circuit configuration in accordance with an illustrative embodiment. Application 105 in FIG. 1 interacts with fabrication system 107 to produce or manipulate configuration 300 as described herein.

Configuration 300 depicts substrate 302. Substrate 302 comprises a material with high thermal conductivity (above a threshold) in the cryogenic temperature range. In an embodiment, substrate 302 is formed using a material that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. For example, substrate 302 may be formed using sapphire, silicon, quartz, gallium arsenide, fused silica, amorphous silicon, or diamond for operations in the temperature range of 77 K to 0.01 K. These examples of substrate materials are not intended to be limiting. From this disclosure, those of ordinary skill in the art will be able to conceive of many other materials suitable for forming the substrate and the same are contemplated within the scope of the illustrative embodiments.

Substrate 302 comprises layer 304 at a bottom surface. Layer 304 comprises the same material as substrate 302. Layer 304 is an integral portion of the substrate 302. For example, layer 304 can be a bottom surface of the substrate 302. Layer 304 is configured to be removed from the substrate 302.

An embodiment causes a fabrication system, such as fabrication system 107 in FIG. 1, to reduce a thickness of the substrate 302. For example, milling device 306 can be configured to remove layer 304 from the substrate 302 to reduce the thickness. The thickness of the substrate 302 is about 700 nanometers before reduction. Reducing the substrate thickness improves thermal conductivity of the substrate by reducing the overall distance thermal energy needs to travel through the substrate. In an embodiment, the substrate thickness is a function of energy dissipation of a particle in an excited state. For example, additional thermal energy carried by a particle can be more quickly conveyed out of a thinner substrate. In an embodiment, substrate 302 is reduced to a thickness, A, thus forming substrate 308 that exhibits a qubit frequency shift of less than or equal to sixty GHz from a qubit frequency of the substrate 302, a threshold level of qubit frequency shift. In an embodiment, thickness A is in a range between 200 and 300 nanometers, inclusive of both ends of the range. In an embodiment, thickness A is about 200 nanometers.

In an embodiment, layer 304 is removed from the substrate 302 by a milling device. For example, milling device 306 can be a micro-milling device with diamond milling bits or laser mill. These examples of milling devices are not intended to be limiting. From this disclosure, those of ordinary skill in the art will be able to conceive of many other milling devices suitable for reducing a thickness of the substrate and the same are contemplated within the scope of the illustrative embodiments. Furthermore, from this disclosure those of ordinary skill in the art will be able to conceive of many other devices and methods suitable for reducing a thickness of the substrate and the same are contemplated within the scope of the illustrative embodiments. For example, a Si substrate can be etched using a solution, such as a Hydrofluoric acid solution, to reduce a thickness of the substrate.

Figure 4:
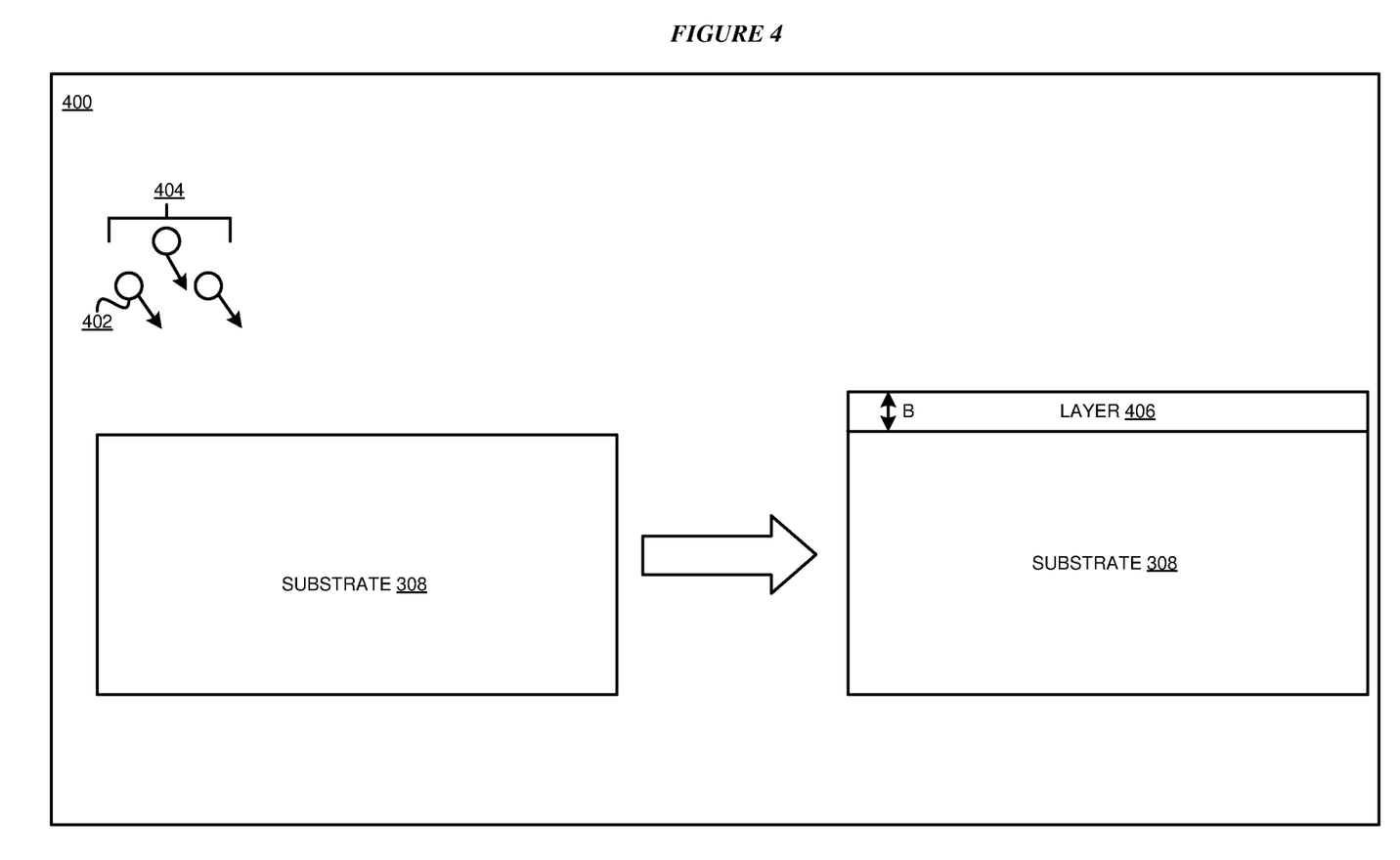
FIG. 4 depicts a block diagram of thermalization of an example quantum circuit configuration in accordance with an illustrative embodiment.

With reference to FIG. 4, this figure depicts a block diagram of thermalization of an example quantum circuit configuration in accordance with an illustrative embodiment. Application 105 in FIG. 1 interacts with fabrication system 107 to produce or manipulate configuration 400 as described herein.

An embodiment causes the fabrication system to deposit material 404, thus forming first layer 406. First layer 406 comprises material 404 with high thermal conductivity (above a threshold) in the cryogenic temperature range. In an embodiment, first layer 406 is formed using a material that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. For example, first layer 406 may be formed using gold, silver, copper, or platinum for operations in the temperature range of 77 K to 0.01 K. These examples of layer materials are not intended to be limiting. From this disclosure, those of ordinary skill in the art will be able to conceive of many other materials suitable for forming the first layer and the same are contemplated within the scope of the illustrative embodiments.

In an embodiment, first layer 406 is deposited on a bottom surface of the substrate 308. For example, first layer 406 can be a thin film deposition of particles 402 on substrate 308 where the milling device removed layer 304. In an embodiment, first layer 406 includes a thickness in a range of about 10 nm-1000 nm, inclusive of both ends of the range. This example of a deposition method is not intended to be limiting. From this disclosure, those of ordinary skill in the art will be able to conceive of many other methods and process suitable for forming the first layer and the same are contemplated within the scope of the illustrative embodiments.

Figure 5:
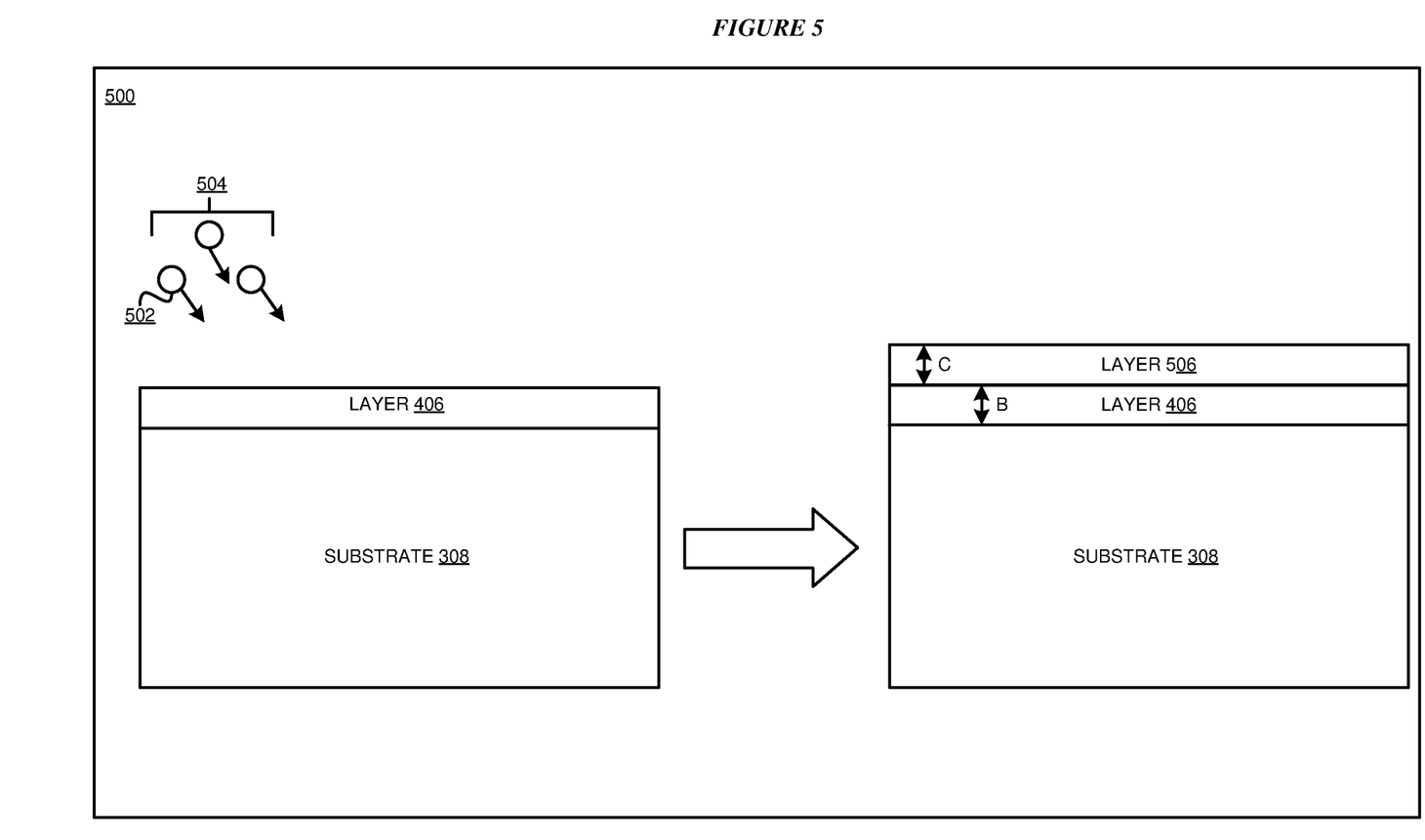
FIG. 5 depicts a block diagram of thermalization of an example quantum circuit configuration in accordance with an illustrative embodiment.

With reference to FIG. 5, this figure depicts a block diagram of thermalization of an example quantum circuit configuration in accordance with an illustrative embodiment. Application 105 in FIG. 1 interacts with fabrication system 107 to produce or manipulate configuration 500 as described herein.

An embodiment causes the fabrication system to deposit material 504, thus forming second layer 506. Second layer 506 comprises material 504 with high thermal conductivity (above a threshold) in the cryogenic temperature range. In an embodiment, second layer 506 is formed using a material that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. For example, second layer 506 may be formed using gold, silver, copper, or platinum for operations in the temperature range of 77 K to 0.01 K. These examples of layer materials are not intended to be limiting. From this disclosure, those of ordinary skill in the art will be able to conceive of many other materials suitable for forming the second layer and the same are contemplated within the scope of the illustrative embodiments.

In an embodiment, second layer 506 is deposited on the first layer 406. For example, second layer 506 can be formed by sintering metallic powder particles 502 on first layer 406. Particles 502 increase an effective surface area for heat transfer between the quantum circuit and the quantum circuit housing. In an embodiment, second layer 506 includes a thickness in a range of about 40 nm-100 mm, inclusive of both ends of the range. This example of a deposition method is not intended to be limiting. From this disclosure, those of ordinary skill in the art will be able to conceive of many other methods and process suitable for forming the first layer and the same are contemplated within the scope of the illustrative embodiments.

Figure 6:
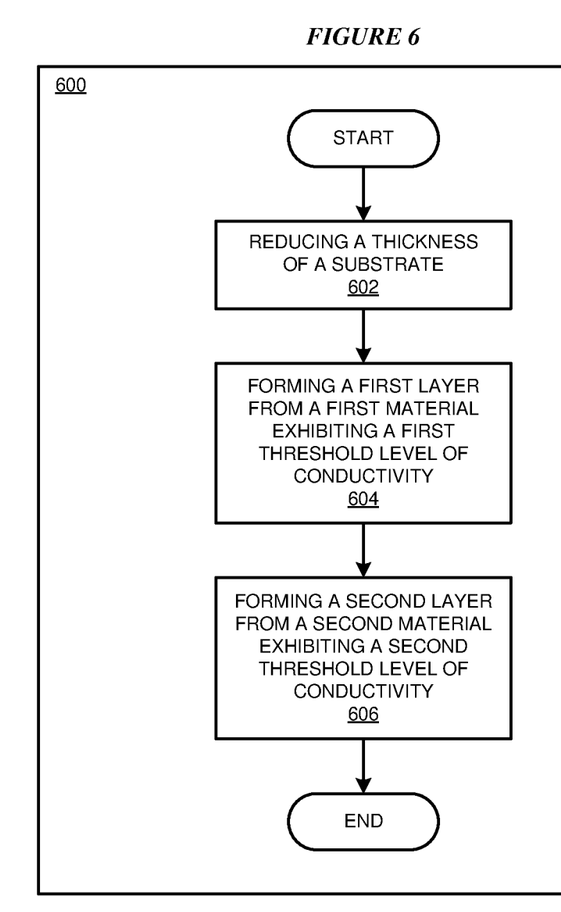
FIG. 6 depicts a flowchart of an improved thermalization process for a cryogenic quantum circuit in accordance with an illustrative embodiment.

With reference to FIG. 6, this figure depicts a flowchart of an improved thermalization process for a cryogenic quantum circuit in accordance with an illustrative embodiment. Process 600 can be implemented in application 105 in FIG. 1, to reduce a thickness of a substrate and deposit layers as described with respect to FIGS. 3, 4, and 5.

The application causes a fabrication system to reduce a thickness of a substrate to a threshold level (block 602). The application causes a fabrication system to form a first layer, on the substrate, from a first material exhibiting a first threshold level of thermal conductivity (block 604). In an embodiment, the application causes a fabrication system to deposit a thin film on the substrate to form the first layer.

The application causes a fabrication system to form a second layer, on the first layer, from a second material exhibiting a second threshold level of thermal conductivity (block 606). In an embodiment, the application causes a fabrication system to sinter metallic powder particles on the first layer to form the second layer. The application ends process 600 thereafter.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A device comprising:
   a substrate having a first thickness, wherein the first thickness is a function of energy dissipation of a particle;
   a first thermal layer, formed on the substrate, of a first material that exhibits a first threshold level of thermal conductivity and has a second thickness less than the first thickness,
   wherein the first threshold level of thermal conductivity is achieved at a cryogenic temperature range in which a quantum circuit operates; and
   a second thermal layer, formed on the first thermal layer, of a second material that exhibits a second threshold level of thermal conductivity and has a third thickness greater than the second thickness and less than the first thickness,
   wherein the second threshold level of thermal conductivity is achieved at a cryogenic temperature range in which a quantum circuit operates.

2. The device of claim 1, the second thermal layer comprising a sintered metal powder.

3. The device of claim 1, the first intervening material comprising a thin film at a bottom of the substrate.

4. The device of claim 1, wherein the substrate is milled to reduce the thickness.

5. The device of claim 4, wherein milling is performed by a laser mill.

6. The device of claim 1, wherein the first thickness of the substrate is in a range between 300 and 200 nanometers, inclusive of each end of the range.

7. The device of claim 1, wherein the substrate is etched to reduce the thickness.

8. The device of claim 1, wherein the substrate is formed of a third material that exhibits at least a third threshold level of thermal conductivity, wherein the third threshold level of thermal conductivity is achieved at a cryogenic temperature range in which a quantum computing circuit operates.

9. The device of claim 1, wherein the first material comprises at least one of gold, copper, platinum, and silver.

10. The device of claim 1, wherein the first thickness of the substrate is about 200 nanometers.

* * * * *